Jan. 23, 1968 J. W. BAUR 3,365,587

CIRCUIT FOR GENERATING LARGE PULSES OF ELECTRICAL CURRENTS HAVING SHORT RISE AND FALL TIMES

Filed March 11, 1964 2 Sheets-Sheet 1

INVENTOR.

JOHN BAUR

BY

ATTORNEY

Jan. 23, 1968 J. W. BAUR 3,365,587

CIRCUIT FOR GENERATING LARGE PULSES OF ELECTRICAL CURRENTS HAVING SHORT RISE AND FALL TIMES

Filed March 11, 1964 2 Sheets-Sheet 2

INVENTOR.
JOHN BAUR
BY
ATTORNEY

United States Patent Office 3,365,587

Patented Jan. 23, 1968

3,365,587

CIRCUIT FOR GENERATING LARGE PULSES OF ELECTRICAL CURRENTS HAVING SHORT RISE AND FALL TIMES

John W. Baur, Phoenix, Ariz., assignor to General Electric Company, a corporation of New York Filed Mar. 11, 1964, Ser. No. 350,992
7 Claims. (Cl. 307—263)

ABSTRACT OF THE DISCLOSURE

A circuit for generating large pulses of electrical currents has a timing circuit for accurately controlling the time duration of the pulses generated. An amplifier increases the amplitude of the pulses. This amplifier has a circuit for decreasing the rise and fall times of these amplified pulses.

This invention relates to electrical circuits for generating pulses characterized by large electrical currents and relates more particularly to circuits which provide large-current pulses having a predetermined duration and having short rise and fall times.

Electronic data processing systems use a high-frequency train of current pulses to provide timing or "clock" pulses to a large number of circuits. These clock pulses are rectangular in shape and are of short duration. In modern high-speed data processing systems the duration of a clock pulse is measured in nanoseconds; where a nanosecond is $10^{-9}$ seconds. In one type of system the rise time of a clock pulse is approximately one nanosecond; where rise time is the time for a current pulse to change from a minimum value to a maximum value. The fall time of a clock pulse is approximately four nanoseconds; where fall time is the time for a current pulse to change from a maximum value to a minimum value.

In a large electronic data processing system these clock pulses supply current to simultaneously trigger several hundred transistor flip-flops. The clock pulse generator which originates these pulses does not provide enough current to drive all of the flip-flops. Therefore, it is necessary to use current amplification between the clock pulse generator and the transmission lines which carry the pulses to the flip-flops. Pulses having a large amplitude of current will hereafter be referred to as large-current pulses.

In prior art circuits used in low-speed data processing systems, the output terminal of the clock pulse generator is connected to the signal-input terminals of several current amplifiers employing transistors as the active circuit elements. Each of these amplifiers has its output terminal connected to one end of a coaxial cable. The coaxial cable is connected to the input terminals of several flip-flops. Due to delays which are inherent in the transistors used, such prior art circuits increase the rise and fall times of the clock pulses. However, if rise and fall times of the pulses applied to the flip-flops were too long, some flip-flops would be triggered before other flip-flops were triggered. Therefore, for simultaneously triggering the flip-flops in high-speed data processing systems, it is necessary that the clock pulses be reshaped so that the rise and fall times of these pulses are reduced, instead of being provided with longer rise and fall times as in the prior art.

Accordingly, pulse shaping circuits are needed which will amplify and reshape pulses from the clock pulse generator.

It is, therefore, the principal object of the present invention to provide an improved circuit for delivering large pulses of current.

Another object of this invention is to provide a circuit that delivers large-current pulses having short rise and fall times.

Another object of this invention is to provide a circuit that delivers large-current pulses, each pulse having a predetermined duration.

Another object of this invention is to provide a circuit that reshapes pulses of current, each reshaped pulse having a predetermined duration.

The foregoing objects are achieved by providing a circuit which uses current pulses from a clock generator ot trigger a first current switch. The first current switch develops pulses of current which are applied to an inductor. These pulses of current cause the inductor to develop pulses of voltage. The duration of each pulse of voltage is timed by the inductor. These developed pulses of voltage are used to control a second current switch so that current is switched from an output transistor amplifier to an intermediate transistor amplifier. The intermediate amplifier then removes the charges from the output amplifier transistor thereby rapidly changing the output amplifier transistor from a conducting to a nonconducting condition. This dual action of switching current and removing charges from the output transistor causes the output current and voltage thereof to change more rapidly than is possible in prior art circuits. Thus, the novel circuit of the instant invention provides output current pulses having shorter rise and fall times than the pulses from the clock pulse generator. These output pulses are greatly increased in current amplitude over the original clock pulses and have an accurately timed duration.

Other objects and advantages of the invention will become apparent from the following detailed description when taken in connection with the accompanying drawings, wherein.

Figure 1:
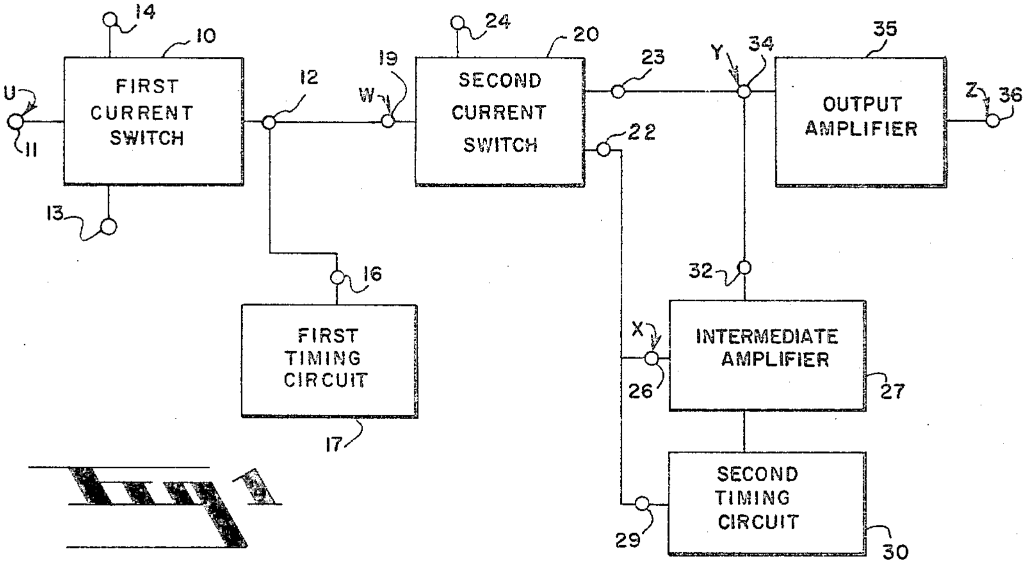
FIG. 1 is a simplified block diagram of the present invention.

The pulse generator of FIG. 1 comprises a pair of current switches, a pair of timing circuits and a pair of amplifiers. A first current switch 10, is connected to a signal-input terminal 11 for receiving clock pulses as input signal. Each current switch is a circuit having one current-input terminal, two current-output terminals, and one signal-input terminal. A source of current connected to the current-input terminal is switched from one of the current-output terminals to the other current-output terminal in response to a signal applied to the signal-input terminal. When the proper signal is applied to the signal-input terminal, current is delivered at one of the current-output terminals. When the signal is no longer applied, current is delivered at the other current-output terminal.

Current switch 10 delivers current at a first current-output terminal 12 or a second current-output terminal 13. Terminal 13 is coupled to an input terminal of a current sink, also not shown. Switch 10 has a current-input terminal 14 which is connected to a source of electrical voltage and current, not shown. Terminal 12 is coupled to an input terminal 16 of a first timing circuit 17 and to a signal-input terminal 19 of a second current switch 20. A timing circuit of the type used herein, is a circuit which initially accepts no current when a potential or current source is applied to the input terminal of the timing circuit and to another circuit. A given time duration after the source is applied, the timing circuit accepts all of the available current. Therefore, timing circuit 17 determines the time interval that current is permitted to flow to terminal 19 of switch 20 and thereby determines the duration of pulses which are generated by the circuit of FIG. 1.

Switch 20 delivers current at a first current-output terminal 22 or a second current-output terminal 23. Switch 20 has a current-input terminal 24 which is connected to a source of electrical voltage and current, not shown. Terminal 22 is conencted to an input terminal 26 of an intermediate amplifier 27 and to an input terminal 29 of a second timing circuit 30. An output terminal 32 of amplifier 27 is connected to an input terminal 34 of an output amplifier 35. Amplifier 35 has an output terminal 36. Amplifier 27 and switch 20 combine to supply a signal current to the input terminal of amplifier 35. This combined signal current enables amplifier 35 to change the output voltage and current at terminal 36 more rapidly than would otherwise be possible. The current at terminal 34 causes amplifier 35 to produce a current having a larger amplitude. This current is delivered at terminal 36. Timing circuit 30 is similar in function to timing circuit 17 which has been discussed previously. Circuit 30 determines the time interval that current is permitted to flow to terminal 26 of amplifier 27 and thereby determines the duration that amplifier 27 supplies current to terminal 34 of amplifier 35.

Figure 2:
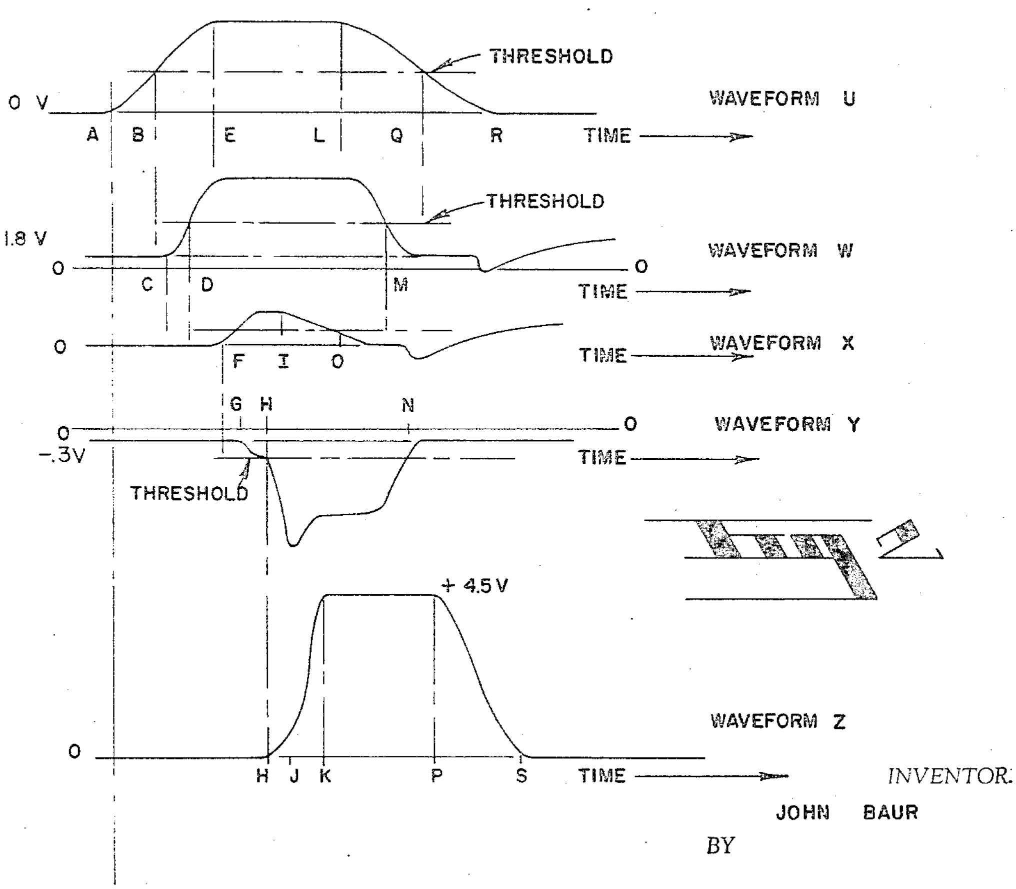
FIG. 2 illustrates waveforms useful in explaining the operation of the instant invention.

The typical voltages of terminals 11, 19, 26, 34 and 36 are shown respectively in waveforms U, W, X, Y and Z of FIG. 2.

The operation of the pulse generator of FIG. 1 will now be described with reference to the waveforms shown in FIG. 2. A typical current at the output terminal of a clock pulse generator produces a signal having the voltage versus time waveform shown in waveform U. This signal is received by terminal 11. Prior to time A (FIG. 2) the voltage at terminal 11 causes switch 10 to deliver current to terminal 13. No current is delivered to terminal 12. The voltage at terminal 19 is held at a reference voltage at this time by a constant voltage source connected thereto, but not shown. This reference voltage at terminal 19 causes switch 20 to deliver current to terminal 23. No current is delivered to terminal 22. The voltage at terminal 26 is held at a reference voltage at this time by a constant voltage source connected thereto, but not shown. Current from terminal 23 produces the voltage having the value shown in waveform Y (FIG. 2) at terminal 34. The voltage at terminal 34, in turn, causes amplifier 35 to produce a voltage having the value shown in waveform Z.

Prior to time B (FIG. 2) the voltage at terminal 11 is less than a predetermined threshold voltage. The threshold voltage is the minimum voltage required on terminal 11 to cause switch 10 to switch a current to terminal 12 from terminal 13. When this threshold voltage is reached or exceeded, switch 10 delivers current to terminal 12.

After time B, switch 10 delivers current to terminal 12. This current flows to terminal 16 of circuit 17 and to terminal 19 of switch 20. This current produces a signal having the voltage shown in waveform W (FIG. 2) at terminals 16 and 19. Timing circuit 17 determines the duration between time D and time M (waveform W) and thereby determines the duration of the output pulse at terminal 36.

The delay between the time the threshold voltage is reached at terminal 11 (time B, waveform U) and the time the voltage starts to change at terminal 12 (time C, waveform W) is caused by transistors used in the circuit. Semiconductor materials used in transistors, such as transistors which are employed in the current switches and amplifiers of FIG. 1, cause a time delay in the circuit response. Due to electrical charges stored in the semiconductor material, a substantial amount of time is required to change a transistor from a nonconductive condition to a conductive condition or from a conductive condition to a nonconductive condition. Therefore, there is some delay between the time the threshold voltage (waveform U) is reached at terminal 11 and the time a change occurs in the voltage (waveform W) at terminal 19.

At time D (waveform W, FIG. 2) the voltage at terminal 19 reaches a predetermined threshold voltage. This threshold voltage is the minimum voltage required on terminal 19 to cause switch 20 to switch a current from terminal 23 to terminal 22. When the voltage at terminal 19 reaches the threshold voltage, switch 20 begins a switching action. This action switches current to terminal 22 from terminal 23. No current flows to terminal 23 and to terminal 34. Current from terminal 22 flows to terminal 29 of timing circuit 30 and to signal-input terminal 26 of amplifier 27. The input current to amplifier 27 causes amplifier 27 to remove electrical charges from the transistor in amplifier 35. Removing charges from the transistor in amplifier 35 rapidly changes this transistor to a nonconductive condition and causes a rapid change in the voltage at terminal 36. Terminating current flow to amplifier 35 and removing charges from the transistor of amplifier 35 causes the voltage at terminal 36 to rise more rapidly than is possible without this dual action. Timing circuit 30 determines the interval during which charges are removed from the transistor of amplifier 35.

The rapid rise in voltage at terminal 36 is illustrated in waveform Z. The rise time of this output voltage, from time J to time K, is much shorter than the rise time of the input voltage pulse (waveform U) applied to terminal 11.

After time M (waveform W) circuit 17 is accepting a large portion of the current delivered to terminal 12 of switch 10. The current which flows to terminal 19 of switch 20 has been reduced so that the voltage produced at terminal 19 is less than the threshold voltage which is required to cause switch 20 to deliver current to terminal 22. Therefore, immediately after time M, switch 20 begins a switching action. This action switches current to terminal 23 from terminal 22.

The delay between the time when the voltage at terminal 19 is reduced below the threshold voltage (time M, waveform W) and the time the voltage at terminal 36 starts to change (time P, waveform Z) is caused by semiconductor materials used in transistors employed in switch 20 and amplifier 35.

After time P (waveform Z) the current to terminal 34 of amplifier 35 causes amplifier 35 to produce a voltage which decreases rapidly to a zero value at time S (waveform Z).

Waveform X shows a voltage waveform which is produced at terminal 26 of amplifier 27. Waveform Y shows a voltage waveform which is produced at terminal 34 of amplifier 35. Details of these waveforms will be described hereinafter.

Thus, the novel arrangement of current switches, timing circuits and amplifiers employed in the pulse generator of FIG. 1 use signals having the input voltage waveform shown in waveform U to initiate a switching action. This switching action produces pulses having rise and fall times which are shorter than those of the input voltage waveform.

Figure 3:
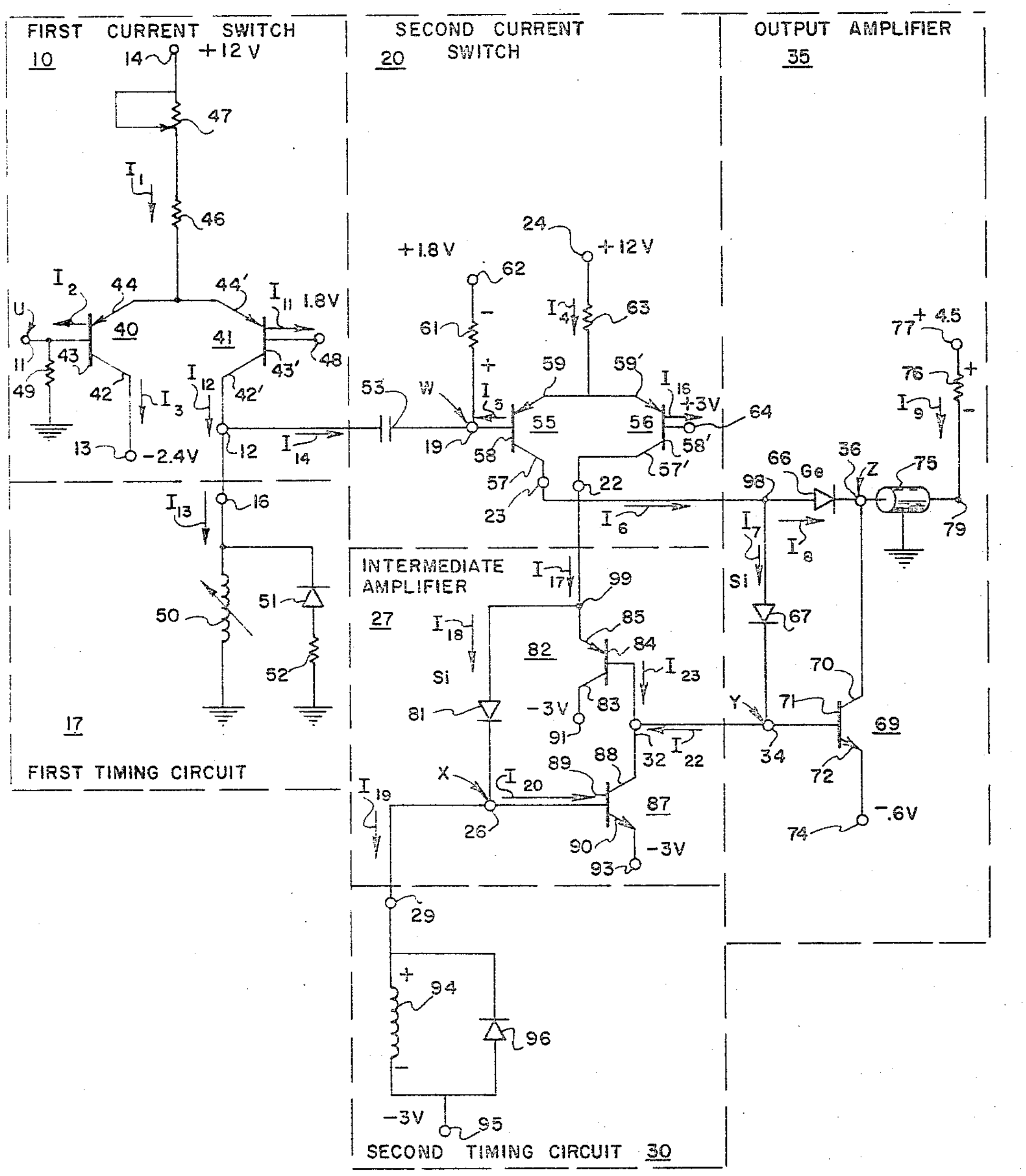
FIG. 3 is a circuit diagram of one embodiment of the present invention.

FIG. 3 illustrates a circuit embodiment of the invention of FIG. 1. The first current switch 10 comprises a pair of transistors 40 and 41, with transistor 40 having a collector 42, a base 43 and an emitter 44. Similarly, transistor 41 includes a collector 42′, a base 43′ and an emitter 44′. The first current switch 10 is designed to deliver current to terminal 12 or terminal 13. A fixed resistor 46 and a variable resistor 47 are connected in series between terminal 14 and emitters 44 and 44′ of transistors 40 and 41. Resistors 46 and 47 limit the amplitude of current through transistors 40 and 41 and thereby function with timing circuit 17 in determining the duration of pulses generated by the circuit. Terminal 14 is connected to a suitable positive potential source such as +12 volts. Base 43′ of transistor 41 is connected to a terminal 48 which is connected to a suitable positive potential such as +1.8 volts. A resistor 49 is connected between base 43 of transistor 40 and a source of reference potential such as ground. Collector 42 of transistor 40 is connected to terminal 13 which is connected to a suitable negative potential such as −2.4 volts. Base 43 of transistor 40 is connected to input terminal 11. Collector 42′ of transistor 41 is connected to output terminal 12.

Timing circuit 17 determines the duration of pulses which are generated by the circuit of FIG. 3. Timing circuit 17 is coupled to switch 10 with terminal 16 being connected to terminal 12 of switch 10. An inductor 50 is connected between terminal 16 and a source of reference potential such as ground. Inductor 50 is one of the most significant parameters which determines the duration of the pulses generated by the circuit. A diode 51 and a resistor 52 are connected in series across inductor 50. Diode 51 and a resistor 52 prevent a large voltage potential from developing across inductor 50 when the amplitude of current through inductor 50 changes.

A capacitor 53 transfers pulses of current from switch 10 to switch 20. Capacitor 53 has one terminal thereof connected to terminal 12 of switch 10 and the other terminal connected to terminal 19 of switch 20.

Switch 20 comprises a pair of transistors 55 and 56, with transistor 55 having a collector 57, a base 58 and an emitter 59. Similarly, transistor 56 includes a collector 57′, a base 58′ and an emitter 59′. Switch 20 is designed to deliver current at terminal 22 or terminal 23. Terminal 19 is connected to base 58 of transistor 55. A resistor 61 is connected between base 58 of transistor 55 and a terminal 62 which is connected to a suitable positive potential such as +1.8 volts. Emitters 59 and 59′ of transistors 55 and 56 are connected by a resistor 63 to terminal 24 which is connected to a suitable positive potential such as +12 volts. Base 58′ of transistor 56 is connected to a terminal 64 which is connected to a suitable positive potential such as +3 volts. Collector 57 of transistor 55 is connected to terminal 23. Collector 57′ of transistor 56 is connected to terminal 22.

A germanium diode 66 and a silicon diode 67 transfer current from switch 20 to amplifier 35 and prevent saturation of the transistor used in amplifier 35. The anodes of diodes 66 and 67 are connected together and to terminal 23 of switch 20.

Amplifier 35 comprises a transistor 69, having a collector 70, a base 71 and an emitter 72, to deliver pulses of current to output terminal 36. The cathode of diode 66 is connected to collector 70 and to terminal 36. The cathode of diode 67 is connected to base 71 and to terminal 34. Emitter 72 is connected to a terminal 74 which is connected to a suitable negative potential such as −0.6 volt. Collector 70 is connected to a suitable load such as a coaxial cable 75. Cable 75 is used to carry pulses to flip-flops in a data processing system. A resistor 76 is connected between the end of cable 75 and a terminal 77. Terminal 77 is connected to a suitable positive potential such as +4.5 volts. The shield of cable 75 is connected to ground. A junction point 79 between cable 75 and resistor 76 can be connected to a plurality of flip-flops so that flip-flops can be triggered simultaneously.

A silicon diode 81 and a germanium transistor 82 transfer pulses of current from switch 20 to amplifier 27 and prevent saturation of the transistor used in amplifier 27.

Transistor 82 has a collector 83, a base 84 and an emitter 85.

Amplifier 27 comprises a transistor 87, having a collector 88, a base 89 and an emitter 90 and supplies a current to amplifier 35. The anode of diode 81 and emitter 85 of transistor 82 are connected to terminal 22 of switch 20. Collector 88 of transistor 87 is connected to terminal 32 which is connected to base 84 of transistor 82 and to terminal 34 of amplifier 35. Collector 83 of transistor 82 is connected to a terminal 91 which is connected to a suitable negative potential such as −3 volts. Emitter 90 of transistor 87 is connected to a terminal 93 which is connected to a suitable negative potential such as −3 volts. The cathode of diode 81 is connected to terminal 26 which is connected to base 89 of transistor 87.

Terminal 29 of timing circuit 30 is connected to terminal 26 of amplifier 27. An inductor 94 is connected between terminal 29 and a terminal 95. Terminal 95 is connected to a suitable negative potential such as −3 volts. A diode 96 is connected across inductor 94. Diode 96 prevents a large voltage potential from developing across inductor 94 when current through inductor 94 changes.

The operation of the circuit of FIG. 3, as presently understood, will now be described. Prior to time A (FIG. 2) the voltage potential at terminal 11 is less than the voltage potential at terminal 48. A current $I_1$ flows from terminal 14 through resistors 47 and 46 to emitter 44 of transistor 40 where the current divides. A current $I_2$ flows through emitter 44 to base 43 of transistor 40, through resistor 49 to ground, and a current $I_3$ flows through emitter 44 to collector 42 of transistor 40 to terminal 13. The −2.4 volts potential connected to terminal 13 functions as a current sink for current $I_3$. Transistor 41 is nonconductive as the base of transistor 41 is more positive than the emitters of transistors 40 and 41.

At the same time, in switch 20, a current $I_4$ flows from terminal 24 through resistor 63 to emitter 59 of transistor 55 where the current divides. A current $I_5$ flows through emitter 59 to base 58 of transistor 55 through resistor 61 to terminal 62. A current $I_6$ flows through emitter 59 to collector 57 of transistor 55 to junction point 98 where current $I_6$ divides with a current $I_7$ flowing through diode 67, through base 71 to emitter 72 of transistor 69 to terminal 74; and a current $I_8$ flowing through diode 66, through collector 70 to emitter 72 of transistor 69 to terminal 74. Transistor 56 is nonconductive as the base of transistor 56 is more positive than the emitters of transistors 55 and 56. Transistor 87 is nonconductive as there is no current from the collector of transistor 56 to the base of transistor 87. A current $I_9$ flows from terminal 77 through resistor 76, cable 75 and collector 70 to emitter 72 of transistor 69 to terminal 74. Current $I_9$ provides the voltage polarities shown across resistor 76. This voltage drop across resistor 76 subtracts from the voltage potential at terminal 77 so that the voltage at output terminal 36 is approximately at ground potential.

Germanium diode 66 and silicon diode 67 together prevent saturation in transistor 69. When a transistor saturates, it conducts so heavily that the output current can no longer increase in response to an increase of signal input current. Saturation causes an excess of electrical charges in the transistor base. It is impossible to change a transistor to a nonconductive condition until these charges are removed from the transistor. If saturation is prevented, fewer charges are stored in the transistor and the time required to remove these charges and to change a transistor to a nonconductive condition is reduced. The voltage drop across conducting silicon diode 67 is greater than the voltage drop across conducting germanium diode 66. The result is that collector 70 is more positive than base 71. Due to the relative potential at collector 70 and base 71, base current $I_7$ is limited so that transistor 69 does not saturate.

At time B (waveform U, FIG. 2) the input voltage at terminal 11 reaches a threshold voltage. The threshold voltage is that voltage which causes switch 10 to begin to switch current $I_1$ from transistor 40 to transistor 41. Due to time delays in transistors 40 and 41, this switching action is completed at approximately time E. When this switching is completed, current $I_1$ flows from terminal 14 through resistors 47 and 46 to emitter 44′ of transistor 41 where current $I_1$ divides. A current $I_{11}$ flows through emitter 44′ to base 43 (of transistor 41 to terminal 48. A current $I_{12}$ flows through emitter 44′ to collector 42′ of transistor 41 to terminal 12 where current $I_{12}$ divides. A current $I_{13}$ flows from terminal 12 through inductor 50 to ground. Current $I_{13}$ is very small at time D (waveform W), but gradually increases until later all of current $I_{12}$ flows through inductor 50. A current $I_{14}$ flows from terminal 12 to the left plate of capacitor 53, from the right plate of capacitor 53 through resistor 61 to terminal 62. Current $I_{14}$ provides the voltage polarities shown across resistor 61. This voltage drop across resistor 61 adds to the voltage potential at terminal 62 thereby increasing positively the voltage at base 58 of transistor 55 so that transistor 55 is subsequently rendered nonconductive.

At time D (waveform W, FIG. 2) the voltage at terminal 19 reaches a threshold voltage. The threshold voltage is that voltage which cause switch 20 to begin to switch current $I_4$ from transistor 55 to transistor 56. When this switching is completed current $I_4$ flows from the terminal 24 through resistor 63 to emitter 59′ of transistor 56 where current $I_4$ divides. A current $I_{16}$ flows through emitter 59′ to base 58′ of transistor 56 to terminal 64. A current $I_{17}$ flows from emitter 59′ to collector 57′ of transistor 56 to junction point 99. A current $I_{18}$ flows from junction point 99 through diode 81 to terminal 26 where it divides. A current $I_{19}$ flows from terminal 26 through inductor 94 to terminal 95. $I_{19}$ is originally very small but gradually increases until later all of $I_{18}$ flows through inductor 94.

At time F (waveform X), a current $I_{20}$ begins to render transistor 87 conductive. Current $I_{20}$ flows from terminal 26 through base 89 to emitter 90 of transistor 87 to terminal 93. When transistor 87 is rendered conductive a current $I_{22}$ begins to flow from base 71 of transistor 69 through collector 88 to emitter 90 of transistor 87 to terminal 93 thereby removing charges from base 71 of transistor 69. These charges, themselves, constitute part of $I_{22}$. This removal of charges from the base causes the voltage at terminal 34 to change, as shown at time G (waveform Y).

At time H (waveform Y) the voltage at terminal 34 reaches a threshold voltage. The threshold voltage is that voltage which renders transistor 69 nonconducting and permits the voltage potential at terminal 36 to rise rapidly to +4.5 volts.

A current $I_{23}$ flows from junction point 99 through emitter 85 to base 84 of transistor 82, through collector 88 to emitter 99 of transistor 87 to terminal 93.

Germanium transistor 82 and silicon diode 81 together prevent saturation in transistor 87. The voltage potential across silicon diode 81 is greater than the voltage potential across germanium transistor 82. The result is that collector 88 is more positive than base 89. Due to the relative potentials at collector 88 and base 89, base current $I_{20}$ is limited so that transistor 87 does not saturate.

When a source of current is applied to an inductor, the voltage drop across the inductor, V, is equal to $L\,di/dt$, where L is the value of the inductor and $di/dt$ is the time rate of current change. When all of current $I_{18}$ flowing to terminal 26 flows through inductor 94, current through inductor 94 no longer increases. The rate of current change, $di/dt$ through inductor 94 has a zero value so the voltage across inductor 94 has a zero value. Thus, as the current through inductor 94 approaches a value of current equal to the value of current $I_{18}$, $di/dt$ decreases toward a zero value. The voltage drop across inductor 94 of timing circuit 30 also decreases toward a zero value as shown between time I and time M in waveform X (FIG. 2).

At time O (waveform X) the voltage drop across inductor 94 has decreased so that the voltage potential at base 89 of transistor 87 is less than the threshold voltage. The voltage polarities shown across inductor 94 (FIG. 3) are the same as the polarities between base and emitter of transistor 87 as terminals 93 and 95 are each connected to a —3 volt source. When the voltage between base 89 and emitter 90 is less than the threshold voltage transistor 87 will be rendered nonconductive. Currents $I_{22}$ and $I_{23}$ no longer flow so that no base current flows in transistor 69. Thus, transistor 69 can again be rendered conductive when current $I_7$ again flows through diode 67.

Meanwhile, current $I_{13}$ through inductor 50 of timing circuit 17 has increased and the voltage potential across resistor 61 of switch 20 has decreased until at time M (waveform W) the potential at base 58 of transistor 55 is no longer great enough to hold the transistor 55 nonconductive. Current $I_4$ again flows to emitter 59 of transistor 55. Current $I_6$ flows from emitter 59 to collector 57 of transistor 55. Transistor 69 of amplifier 35 is again conductive due to base current $I_7$. Current $I_9$ flows from terminal 77 through resistor 76, cable 75 and transistor 69 to terminal 74, thereby rapidly decreasing the voltage at terminal 36 to ground potential at time S (waveform Z).

The value of resistor 47 in switch 10 can be changed to change the duration of the output pulse shown in waveform Z. If the value of resistor 47 is increased, a smaller current $I_1$ will flow. This results in a smaller current $I_{12}$ through emitter 44′ to collector 42′ of transistor 41, thereby resulting in a smaller current $I_{14}$ and a smaller voltage across resistor 61. Transistor 55 of switch 20 and transistor 69 of amplifier 35 will each be nonconductive for a shorter period of time and the duration of the output pulse at terminal 36 of amplifier 35 is reduced.

To obtain a larger current from the output amplifier, additional transistors can be connected in parallel with transistor 69.

Thus, the objects set forth herein are realized by the instant invention, wherein a novel arrangement of current switches, inductor timing circuits and current amplifiers are employed to develop large-current pulses each having a predetermined duration. The duration of each pulse is accurately controlled.

While the principles of the invention have now been made clear in an illustrative embodiment, there will be immediately obvious to those skilled in the art many modifications of structure, arrangement, proportions, the elements, materials, and components, used in the practice of the invention, and otherwise, which are particularly adapted for specific environments and operating requirements without departing from those principles. The appended claims are therefore intended to cover and embrace any such modifications, within the limits only of the true spirit and scope of the invention.

What is claimed is:

1. A large-current pulse generating circuit for use with a current sink and a source of signal pulses, comprising: first and second current switching means, each of said means having a signal input terminal and first and second current output terminals, each of said means controllably delivering a current at one of said first and second output terminals thereof in response to a signal at said input terminal thereof; said input terminal of said first switching means being adapted to receive said signal pulses; an adjustable timing means; said timing means being coupled to said first switching means for controlling the duration of pulses generated by said first switching means; said input terminal of said second switching means being connected to said first output terminal of said first switching means; said second output terminal of said first switching means being adapted for connecting to said current sink; and first and second amplifiers, each of said amplifiers having an input terminal and an output terminal; said input terminal of said first amplifier being connecter to said first output terminal of said second switching means; said input terminal of said second amplifier being connected to said output terminal of said first amplifier and to said second output terminal of said second switching means.

2. A large-current pulse generating circuit for use with a current sink and a source of signal pulses, comprising: first and second current switching means, each of said means having a signal input terminal and first and second current output terminals, each of said means delivering a current at said first output terminal in response to a first level of signal at said input terminal and delivering a current at said second output terminal in response to a second level of signal at said input terminal; said input terminal of said first switching means being adapted to receive the signal pulses; an inductive timing means; said timing means being connected to said first output terminal of said first switching means for controlling the duration of pulses generated by said first switching means; said input terminal of said second switching means being connected to said first output terminal of said first switching means; said second output terminal of said first switching means being connected to said current sink; and first and second amplifiers, each of said amplifiers having an input terminal and an output terminal; said input terminal of said first amplifier being connected to said first output terminal of said second switching means; said input terminal of said second amplifier being connected to said output terminal of said first amplifier and to said second output terminal of said second switching means.

3. A large-current pulse generating circuit for use with a current sink and a source of signal pulses, comprising: first and second current switching means, each of said means having a signal input terminal and first and second current output terminals, each of said means delivering a current at said first output terminal in response to a first level of signal at said input terminal and delivering a current at said second output terminal in response to a second level of signal at said input terminal; said input terminal of said first switching means being adapted to receive the signal pulses; an inductor timing means; said timing means being connected to said first output terminal of said first switching means for controlling the duration of pulses generated by said first switching means; said input terminal of said second switching means being connected to said first output terminal of said first switching means; said second output terminal of said first switching means being connected to said sink; and first and second amplifiers, each of said amplifiers having an input terminal and an output terminal, each of said amplifiers comprising a transistor and a current limiting means for preventing saturation at the transistor thereof; said input terminal of said first amplifier being connected to said first output terminal of said second switching means; said input terminal of said second amplifier being connected to said output terminal of said first amplifier and to said second output terminal of said second switching means.

4. A large-current pulse generating circuit for use with a source of signal pulses, comprising: first and second transistors each having a collector, a base and an emitter; first, second, third and fourth reference potentials; a signal input terminal, said terminal being adapted to receive the signal pulses; resistive means connecting said emitters of said first and second transistors to said first potential; said base of said first transistor being connected to said terminal; said base of said second transistor being connected to said second potential; said collector of said first transistor being connected to said third potential; an inductor, said inductor being connected between said collector of said second transistor and said fourth potential; a current switch for providing a current, said switch having a signal-input terminal and first and second current-output terminals; said collector of said second transistor being coupled to the input terminal of said switch; an intermediate amplifier; and an output amplifier, each of said amplifiers comprising a transistor, each of said amplifiers having a current limiting means for preventing saturation of the transistor thereof and each of said amplifiers having an input terminal and an output terminal; said output terminal of said intermediate amplifier being connected to the input terminal of said output amplifier, said first output terminal of said switch being connected to the input terminal of said output amplifier; and the second output terminal of said switch being connected to the input terminal of said intermediate amplifier.

5. A large-current pulse generating circuit for use with a source of signal pulses, comprising: first and second transistors each having a collector, a base and an emitter; first, second, third and fourth reference potentials; a signal input terminal, said terminal being adapted to receive the signal pulses; resistive means connecting said emitters of said first and second transistors to said first potential; said base of said first transistor being connected to said terminal; said base of said second transistor being connected to said second potential; said collector of said first transistor being connected to said third potential; a first inductor, said inductor being connected between said collector of said second transistor and said fourth potential; a current switch for providing a current, said switch having a signal-input terminal and first and second current-output terminals; said collector of said second transistor being coupled to the input terminal of said switch; an intermediate amplifier; an output amplifier; each of said amplifiers comprising a transistor, each of said amplifiers having a current limiting means for preventing saturation of the transistor thereof and each of said amplifiers having an input terminal and an output terminal; said output terminal of said intermediate amplifier being connected to the input terminal of said output amplifier; and a second inductor, said second inductor being coupled to said intermediate amplifier to determine the duration of time charges are removed from the transistor in said output amplifier; said first output terminal of said switch being connected to the input terminal of said output amplifier; and the second output terminal of said switch being connected to the input terminal of said intermediate amplifier.

6. A large-current pulse generating circuit for use with a source of signal pulses, comprising: first and second transistors each having a collector, a base and an emitter; first, second, third and fourth reference potentials; a signal input terminal, said terminal being adapted to receive the signal pulses; resistive means connecting said emitters of said first and second transistors to said first potential; said base of said first transistor being connected to said terminal; said base of said second transistor being connected to said second potential; said collector of said first transistor being connected to said third potential; an inductor, said inductor being connected between said collector of said second transistor and said fourth potential; a current switch for providing a current, said switch having a signal-input terminal and first and second current-output terminals; said collector of said second transistor being coupled to the input terminal of said switch; an intermediate amplifier; and an output amplifier, each of said amplifiers comprising a transistor having a base, each of said amplifiers having a current limiting means for preventing saturation of the transistor thereof and each of said amplifiers having an input terminal and an output terminal; each of said current limiting means being connected between said input terminal and said output terminal of the corresponding amplifier; said base of said transistor in each of said amplifiers being connected to the corresponding input terminal of said amplifier; said output terminal of said intermediate amplifier being connected to the base of said transistor in said output amplifier to rapidly remove charges from said transistor; said first output terminal of said switch being connected to the input terminal of said output amplifier; and the second output terminal of said switch being connected to the input terminal of said intermediate amplifier.

7. A large current pulse generating circuit for use with a source of signal pulses comprising: a first current switching means having an input terminal for receiving said pulses and an output terminal; an inductor timing means; said timing means being connected to said output terminal of said first switching means for controlling the duration of pulses generated by said first switching means; a second current switching means having a signal input terminal and first and second current output terminals; said input terminal of said second switching means being connected to said output terminal of said first switching means; and first and second amplifiers, each of said amplifiers having an input terminal and an output terminal; said input terminal of said first amplifier being connected to said first output terminal of said second switching means; said input terminal of said second amplifier being connected to said output terminal of said first amplifier and to said second output terminal of said second switching means.

References Cited

UNITED STATES PATENTS

| | | | |
|---|---|---|---|
| 3,181,007 | 4/1965 | Hinds | 307—88.5 |
| 3,192,399 | 6/1965 | Ih | 307—88.5 |
| 3,233,113 | 2/1966 | Apple et al. | 307—88.5 |

OTHER REFERENCES

"Non-saturating Drive Circuit" by Wohlfort et al., IBM Technical Disclosure Bulletin, vol. 3, No. 4, September 1960, pp. 46 and 47.

"Pulse and Digital Circuits," by Millman and Taub, McGraw-Hill, 1956, pp. 164–172 relied on.

ARTHUR GAUSS, *Primary Examiner.*

S. D. MILLER, *Assistant Examiner.*